(12) United States Patent
Schieferdecker et al.

(10) Patent No.: US 11,988,561 B2
(45) Date of Patent: May 21, 2024

(54) METHOD FOR PRODUCING A THERMAL INFRARED SENSOR ARRAY IN A VACUUM-FILLED WAFER-LEVEL HOUSING

(71) Applicant: Heimann Sensor GmbH, Dresden (DE)

(72) Inventors: Jörg Schieferdecker, Dresden (DE); Frank Herrmann, Dohna (DE); Christian Schmidt, Dresden (DE); Wilhelm Leneke, Taunusstein (DE); Bodo Forg, Mainz (DE); Marion Simon, Bad Schwalbach (DE); Michael Schnorr, Hünstetten-Wallbach (DE)

(73) Assignee: Heimann Sensor GmbH, Dresden (DE)

( * ) Notice: Subject to any disclaimer, the term of this patent is extended or adjusted under 35 U.S.C. 154(b) by 244 days.

(21) Appl. No.: 17/624,938

(22) PCT Filed: Jul. 9, 2020

(86) PCT No.: PCT/EP2020/069354
§ 371 (c)(1),
(2) Date: Jan. 5, 2022

(87) PCT Pub. No.: WO2021/005150
PCT Pub. Date: Jan. 14, 2021

(65) Prior Publication Data
US 2022/0283034 A1    Sep. 8, 2022

(30) Foreign Application Priority Data

Jul. 9, 2019    (DE) ..................... 10 2019 118 586.6

(51) Int. Cl.
*G01J 5/02*    (2022.01)
*G01J 5/04*    (2006.01)
(Continued)

(52) U.S. Cl.
CPC ................. *G01J 5/12* (2013.01); *G01J 5/045* (2013.01); *G01J 5/0802* (2022.01);
(Continued)

(58) Field of Classification Search
CPC .. G01J 5/12; G01J 5/045; G01J 5/0802; G01J 2005/106; G01J 5/10; H01L 27/14618;
(Continued)

(56) References Cited

U.S. PATENT DOCUMENTS

| | | |
|---|---|---|
| 2004/0256349 A1 | 12/2004 | Leib et al. |
| 2007/0278605 A1 | 12/2007 | Shibayama |

(Continued)

FOREIGN PATENT DOCUMENTS

| | | |
|---|---|---|
| CN | 102583220 B | 11/2014 |
| DE | 102012216618 A1 | 3/2014 |

(Continued)

*Primary Examiner* — Kiho Kim
(74) *Attorney, Agent, or Firm* — Smartpat PLC

(57) ABSTRACT

A method for producing a thermal infrared sensor array in a vacuum-filled wafer-level housing with particularly small dimensions, consisting of at least two wafers, a cover wafer and a central wafer comprising multiple infrared-sensitive sensor pixels on a respective thin slotted membrane over a heat-insulating cavity is disclosed. A method for producing a high-resolution monolithic silicon micromechanical thermopile array sensor using wafer level packaging technology, wherein the sensor achieves a particularly high spatial resolution capability and a very high filling degree with very small housing dimensions, in particular a very low overall thickness, and can be inexpensively produced using standard CMOS processes. This is achieved in that the cover wafer is first rigidly mechanically connected to the provided central wafer comprising the sensor pixels with the infrared-sensi-
(Continued)

tive pixels by means of wafer bonding, and the central wafer is then thinned out from the wafer rear face to a specified thickness.

17 Claims, 7 Drawing Sheets

(51) Int. Cl.
  *G01J 5/0802* (2022.01)
  *G01J 5/12* (2006.01)
  *H01L 27/146* (2006.01)
  *G01J 5/10* (2006.01)
(52) U.S. Cl.
  CPC .. *H01L 27/14618* (2013.01); *H01L 27/14632* (2013.01); *H01L 27/14649* (2013.01); *H01L 27/14687* (2013.01); *G01J 2005/106* (2013.01)
(58) Field of Classification Search
  CPC ......... H01L 27/14632; H01L 27/14649; H01L 27/14687; H01L 27/14683
  See application file for complete search history.

(56) References Cited

U.S. PATENT DOCUMENTS

| | | |
|---|---|---|
| 2011/0155914 A1 | 6/2011 | Ohhira et al. |
| 2015/0243823 A1 | 8/2015 | Herrmann et al. |
| 2018/0335347 A1 | 11/2018 | Herrmann et al. |

FOREIGN PATENT DOCUMENTS

| | | | |
|---|---|---|---|
| DE | 112013001011 B4 | | 7/2017 |
| EP | 2343523 A1 | | 7/2011 |
| JP | H05283757 A | * | 10/1993 |
| JP | 2005501405 A | | 1/2005 |
| JP | 2005241457 A | | 9/2005 |
| JP | 2010056319 A | | 3/2010 |
| JP | 2012013661 A | | 1/2012 |
| JP | 2013004780 A | | 1/2013 |
| JP | 2015534642 A | | 12/2015 |
| JP | 2016017794 A | | 2/2016 |
| JP | 2019504298 A | | 2/2019 |
| WO | 2006122529 A2 | | 11/2006 |

* cited by examiner a)

b)

c)

d)

e)

METHOD FOR PRODUCING A THERMAL INFRARED SENSOR ARRAY IN A VACUUM-FILLED WAFER-LEVEL HOUSING

TECHNICAL FIELD

The disclosure relates to a method for producing a thermal infrared sensor array in a vacuum-filled wafer-level housing, in monolithic silicon micromechanical technology in the wafer-level package.

BACKGROUND

For the applications of infrared sensor arrays for small economical thermal cameras, both a high spatial and thermal resolving power and minimal housing dimensions of the sensor module are important.

This applies in particular for so-called mobile applications, for example in smartphones, or the like.

These applications must achieve a high thermal resolving power with good measurement accuracy in a smallest space, while having minimal overall dimensions of the sensor module. A very small overall height of the infrared array sensor module is in this case particularly important, for example in order to be able to accommodate a miniaturized thermal camera constructed therewith in the housing of the smartphone itself. A total overall height of the sensor array, including all the optics, of <2.5 . . . 3 mm is necessary in order to be able to accommodate the thermal minicamera on the circuit board next to the small CMOS camera having the same viewing direction.

Only thermal (uncooled) sensors may be envisioned therefor as an infrared sensor array. This group of thermal sensors includes so-called microbolometers, pyroelectric arrays and thermopile arrays (TP arrays).

In order to achieve the required measurement accuracies, continuously modulated mechanical choppers are required for pyroelectric arrays and so-called mechanical shutters are required for microbolometers, and these need to be installed in the beam path in addition to the sensor array and the infrared optics. The additional mechanical dimensions of the controlled chopper or shutter modules increase the housing height and make installation in a smartphone housing difficult. Only thermopile sensor arrays (TP arrays) achieve the required measurement accuracies without additional mechanical choppers or shutters in the beam path.

For miniaturized high-resolution TP arrays, the pixel dimensions must be small, which is required by the hermetic encapsulation of the sensitive array chip under vacuum. Since the conventional housings (such as metal housings, for example of the TO series) are likewise too large, wafer-level packaging (WLP) remains the most promising variant. This is a particularly economical form of vacuum sealing of the thermopile array chip, in which a wafer assembly is closed in a hermetically tight fashion with the active elements in the middle under high vacuum.

WLP also has the further advantage that all wafers based on silicon have the same thermal expansion coefficient. This means that if the temperature of the sensor changes during packaging or use, no additional stress occurs between the cover/sensor and/or bottom wafer since they all have the same expansion coefficient.

Since individual sensor pixels of a sensor array deliver only a very small voltage signal (typically in the μV range), the signals need to be amplified locally, if possible in the sensor package itself. Since there are very many pixels on the same sensor chip in a high-resolution array sensor, very many preamplifiers (operating in parallel) also need to be provided.

Infrared thermopile sensor arrays have long been known in various forms and designs. Thermopile sensors produced in silicon micromechanics usually consist of a thin membrane on which there are thermocouples produced in thin-film technology. Below the membrane, there is a hollow in the substrate.

The "hot" contacts of the thermocouples are located in the central part of the membrane, and the "cold" contacts lie on the silicon edge, which serves as a heat sink. Between them, there are for example maximally long, narrow beams (bars) which connect the central part of the membrane (absorber region) to the heat sink (Si edge of the pixel) and contain one or more thermocouples.

On both sides of the long beams, there are slits which separate the beams from the central part or the Si sink (supporting body). The majority of the absorption of IR radiation takes place in the central region of the membrane. Particularly in arrays having a high spatial resolution, the pixels are small and the perforations (slits) are very narrow. In order to increase the fill factor of the sensor, an infrared shield (umbrella) may be spread over the membrane or the pixel in order to be able to pick up more infrared radiation by way of the larger area.

The thermocouples (on the beams) are located relatively close to the Si sink, so that a relatively large proportion of heat can flow away through the gas lying in between to the sink. This leads to signal loss. In order to counteract this, vacuum sealing is sought.

The slits in the membrane are used for producing the cavity thereunder. A wafer bonded thereon is used to generate a hermetically sealed closure. Isotropic etching of the substrate below the membrane, however, requires protection of the nearby electronics in order to avoid possible damage.

US 2008/0128620 A1 describes a wafer-level package for a plurality of thermopiles on a thin membrane, below or over which there are cavities for thermal insulation, which are usually etched anisotropically (KOH) but optionally also by DRIE.

The necessary parallel signal processing with very many channels, which would be needed in order to provide a high-resolution TP array having very many small pixels, is not possible for lack of space.

EP 2889 909 proposes a solution having many slits in the region of the absorber of the pixels in order to better lead the Si sacrificial layer below the membrane from the recess outward. In this way, however, effective absorber area and therefore signal and measurement accuracy are lost.

WO 2015004166 A1 describes a method for the hermetic sealing of an electronic apparatus with reduced stress. Here again, elaborate processing is necessary for exposing the pixels, and the application of reflective metal layers on the bottom of the cavity lying below the pixel is difficult or very expensive.

None of the solutions makes it possible to produce particularly small and highly sensitive pixels and to accommodate the necessary signal processing channels on a particularly small area.

DE 10 2006 122 850 presents a high-resolution thermopile array in WLP. This array has three wafers connected to one another (cover, sensor chip and bottom).

However, the thicknesses of the three wafers connected to one another are approximately equal, i.e. the central sensor wafer with the cavities etched in bulk micromechanics with vertical holes through the entire wafer limit the achievable pixel size by tolerances to be complied with. Furthermore, not very many pixels can be accommodated on the sensor wafer because there is not enough space for the parallel signal processing channels needed therefor.

U.S. Pat. No. 8,519,336 B2 proposes a configuration in which an IR-detecting device is located over a reflective layer. An arithmetic evaluation circuit is furthermore located on the circuit board lying underneath. Here, three silicon substrates (wafers) are combined. The receiver unit consists of a thermopile and a reduced-pressure and sealed depression in a silicon substrate. The reflective layer forms a kind of niche underneath the receiver unit. The surface of the niche consists of a reflective material, for example gold or aluminum. By this arrangement, IR radiation which has not been primarily detected in the receiver unit is reflected and focused back again onto the receiver unit for another detection possibility.

The "niches" with the reflective structures have a configuration similar to a parabolic mirror, so that a highest possible proportion of the IR radiation can be reflected back onto the receiver unit.

The necessary electrical contacts extend from the backside of the upper wafer to the front side of the central wafer through so-called through-silicon vias (TSVs) (i.e. through-contacts), which are known per se, through the central wafer in the "3-wafer sandwich" as far as the backside of the wafer and to a signal processing unit, and finally further vias to the backside of the bottom wafer and to solder contacts. This thermopile array in WLP is therefore SMD-capable.

The signal lines may therefore in principle be routed both outside the pixel region or else between the pixels, in which case the signal processing operations for each pixel may be carried out in the bottom wafer below the pixels.

Typical TSVs produced according to the current prior art need lateral dimensions on the wafer which are about one tenth of the wafer thickness. Consequently, for a wafer thickness of 400 . . . 500 μm, typical vias would be about 40 . . . 50 μm in size.

It is therefore not possible to produce arrays with particularly high spatial resolution having particularly small pixels, because only the size of the vias in the field of the pixels increases the lateral pixel dimensions.

This is too much for arrays as a small camera chip in a smartphone, however, since lens optics with a corresponding focal length also actually still need to be mounted over the sensor array chip.

None of the solutions according to the prior art makes it possible to produce a high-resolution infrared sensor array having very many, very small pixels and a particularly small overall height (that they fit for example in a smartphone or the like), which can be produced straightforwardly in a normal CMOS-compatible process.

The sensitivity of an infrared sensor is also dependent on the thermal dissipation through the gas, which surrounds the sensor, and may be increased by means of a vacuum-tight packaging. In a vacuum-tight housing, signal losses due to thermal conduction through the gas are absent or very small. Conventional vacuum housings in construction and connecting technology are however expensive in terms of material and costs in order to achieve the necessary vacuum tightness. Even the normal chip adhesive may in this case become the cost and problem factor because of degassing and leakage. Since the individual materials of the housing are usually different (bottom, cap, optical window), they also have different thermal expansion coefficients which may lead to mechanical stress and leaks.

Packaging and vacuum-tight sealing at the wafer level is economical and may be mass-produced. The necessary vacuum tightness is achieved by encapsulating the thermopile sensor wafer with a cover wafer and a lower bottom wafer.

One disadvantage of the known wafer-level packages (WLP) for a thermopile array is the very large overall height which results from the assembly of a plurality of individual wafers. This is because each of the individual wafers has to be processed and is provided with cavities, metallizations, filter layers or the like. For the sizes of modern semiconductor wafers (which have 200 and 300 mm diameters), this requires a certain minimum thickness of the wafer. If it were too thin (for example only 100 . . . 200 μm), it would break during processing (handling) in most of the systems encountered during production.

Wafer thicknesses of about 400 . . . 500 μm are currently typical and may be processed in serial manufacturing with a reasonable yield. An assembly of 2 wafers then already has a thickness of about 0.8-1 mm, with 2 composite wafers, and about 1.2 . . . 1.5 mm with an assembly of three wafers (the particularly preferred variant with bulk micromechanics as in the known solutions). This prevents a very small total height from being achieved (for example for use in smartphones).

A second disadvantage of the prior art is the low spatial resolution because of excessively large thermopile pixels. The smallest thermopile arrays known to date have pixel dimensions of 90 μm.

A third disadvantage of known thermal infrared array solutions (for example thermopile arrays) is the large lateral overall size, which likewise makes accommodation in small mobile equipment such as smartphones difficult. The sensor array chips are usually mounted in metal TO housings or metal hermetic housings, the external dimensions of which are much larger than the sensor chip itself.

SUMMARY

It is an object to provide a method for producing a thermal infrared sensor array in a vacuum-filled wafer-level housing, in monolithic silicon micromechanical technology in the wafer-level package, which achieves a particularly high spatial resolving power (because of very small pixels) and a very high fill factor with minimal housing dimensions, in particular a very small total thickness, and which may be produced economically by standard CMOS-compatible processes.

The object is achieved by the features of the main claim. Further refinements are found in the associated dependent claims.

The object is achieved in that at least two, preferably three or more semiconductor wafers, for example of silicon or infrared-transmissive glass for the cover wafer, are initially processed separately and subsequently mounted and in this case are thinned in stages:

The cover wafer is preferably provided on the lower side with a cavity measuring from a few 10 to a few 100 μm, and both wafer sides are subsequently provided with so-called antireflection or filter layers. These filter layers are intended on the one hand to allow a particularly high transmission of the cover wafer for the infrared range and are intended to be able to additionally block certain spectral ranges in which, for example, there are transmission losses in the atmosphere that would lead to distance dependency in the measurement of remote objects. These filter layers may also consist of special subwavelength structures.

The depth of the cavity may, for example, amount to about half the total thickness of the cover wafer, because the transmission of the wafer for the IR radiation is thereby also increased. The residual thickness should not become too small, however, so that the wafer assembly remains mechanically stable.

The central wafer or the wafer having the sensor pixels is provided with the functional layers known per se. These include, for example, a plurality of layers of polycrystalline or amorphous silicon of different conductivity, absorber structures (preferably so-called umbrellas) and CMOS structures for the signal processing. All the steps on the surface side (such as the introduction of the future slits in the membrane for the thermal insulation from the Si substrate) need to be carried out before the joining.

The central sensor wafer has a very small residual thickness of <200 . . . 300 µm, preferably <50-100 µm, after the thinning. This allows two advantages in comparison with previously known thermopile array solutions.

On the one hand, much smaller thermopile pixels than previously known because the Si edges of the pixels which remain after the DRIE etching process (which serve for the thermal separation and as a heat sink for the cold contacts) can be reduced to a few micrometers.

On the other hand, much smaller lateral dimensions may also be produced for electrical through-contacts from the front side to the backside of the thermopile wafer (or of the bottom wafer) than would be possible with standard wafer thicknesses of, for example, about 400-500 µm thick.

In the current prior art, typically achievable lateral dimensions of TSV are about one tenth of the wafer thickness. Consequently, with a wafer thickness of 400 µm, typical vias would be about 40 µm in size. However, if the wafer were thinned to 30 µm, for example, the vias would then only be about 3 µm in size. In advanced embodiments, each pixel may therefore still be connected to the backside even with particularly small thermopile pixel dimensions.

The preparation of the electrical contacts for the external further processing of the sensor signals by the array pixels comprises:

Either the central wafer having the sensor pixels and a part of the signal processing electronics is fed outward directly by means of prepared bond pads in the central wafer and future wire bridges, or the signal processing is fed through to the bottom wafer, for example by means of very small vias (so-called through-silicon vias, TSVs). The further signal processing (ROIC) may be accommodated on the bottom wafer. There is more space there than next to the thermopile array on the central wafer.

In the maximum case, each pixel is even fed through individually to the bottom wafer. This becomes possible because of the particularly thin central wafer, which allows very small and particularly precisely through-contacts in the corners of the pixels and therefore further increases the packing density of the array.

In addition to the signal processing, such as preamplifiers and analog/digital converters, a large part of the digital signal preparation, up to the image evaluation in the form of processors, may also be accommodated on the lower bottom wafer (ROIC).

In order to bring signals further down to the carrier substrate, there may be further vias/through-contacts in the bottom wafer in order to be able to feed signals directly downward onto suitable contacts such as solder bumps.

Alignment with the thermal pads of a quad flat no leads package (QFN package) may also be useful therefor, in order to dissipate heat unintentionally produced in the ASIC.

In the cover wafer, there is a depression which has been created by suitable methods such as wet etching or DRIE. The depression should for reasons of mechanical stability be no more than 50% as deep as the thickness of the cover wafer.

In one variant, the bottom wafer (ROIC) may also be thinned very greatly to <0.2 . . . 0.3 mm so that the overall stack of three wafers becomes as thin as possible in order to fit into a mobile device such as a smartphone.

The invention will be explained in more detail below with reference to an exemplary embodiment.

DETAILED DESCRIPTION

It is to be understood that only a detail of the various wafers is respectively represented in FIGS. 1 to 9, and that the wafers are in fact very much larger in area and respectively contain a multiplicity of the described structures next to one another, which are individualized by sawing into individual thermal infrared sensor arrays after manufacture.

Figure 1:
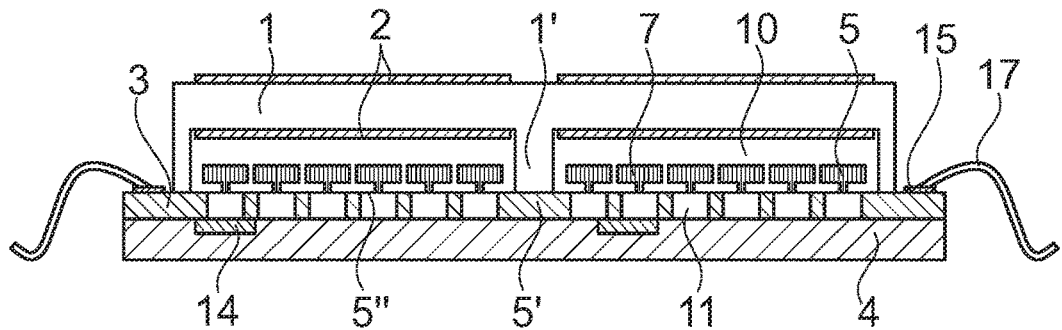
FIG. 1 shows the basic construction of a very thin infrared sensor array in the vacuum wafer-level package as a sectional representation.

FIG. 1 shows the basic construction of a very thin infrared sensor array in the vacuum wafer-level package, having an upper cover wafer 1, a thinned central wafer 3 and a bottom wafer 4, after the respective wafer mounting, but before the individualization. In the cover wafer 1, there is respectively a cavity 10 over a group of sensor pixels 5.

The infrared sensor array contains, according to FIG. 1, a plurality of groups of infrared sensor arrays having a plurality of sensor pixels 5 next to one another or in groups of four or more in a regular distribution, narrow strips 5' on the central wafer 3 being kept free without sensor pixels 5 between the groups, and a cavity 10 respectively being located over each group of sensor pixels 5 in the cover wafer 1. The individual cavities 10 are separated from one another by bars 1', which are respectively supported on a strip 5' and mechanically stabilize the cover wafer 1.

For example, four groups of sensor pixels 5 may be arranged in distributed fashion areally in quadrants on the central wafer 3 so that the strips 5' intersect in the shape of a cross. The cavities 10 in the cover wafer 1 may then be arranged correspondingly so that the bars 1' likewise intersect in the shape of a cross and are supported on the strips 5' of the central wafer 3.

The maximum number of sensor pixels 5, or of corresponding groups, producible on a central wafer 3 is only limited by the size of the sensor pixels 5 and the lateral dimensions of the wafers.

Figure 2:
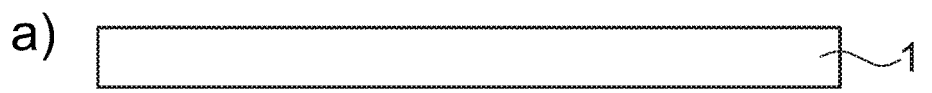
FIG. 2 shows the preparation of the cover wafer, sensor wafer and bottom wafer as individual wafers before mounting in the wafer-level package.
Figure 2:
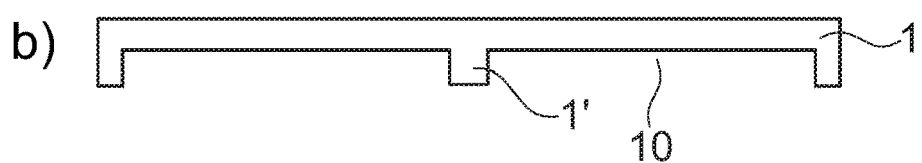
Figure 2:
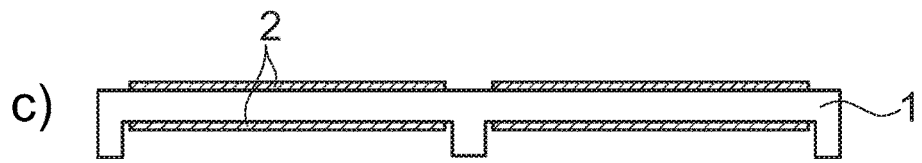
Figure 2:
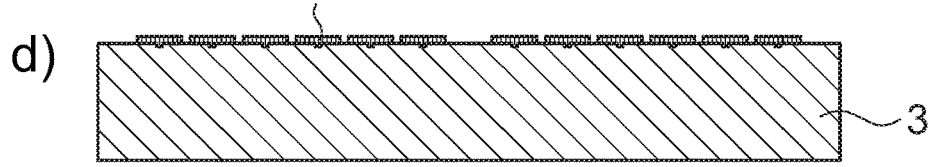
Figure 2:
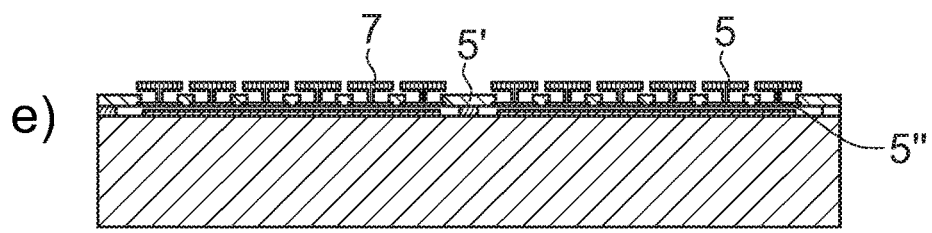
Figure 2:
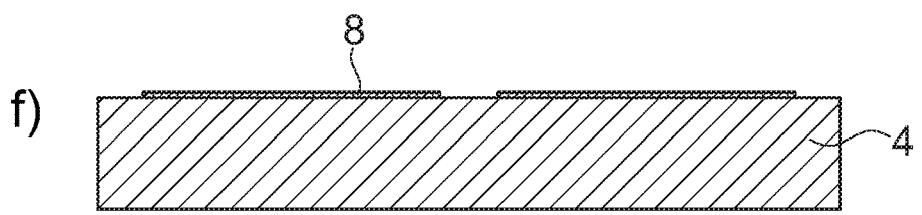
Figure 2:
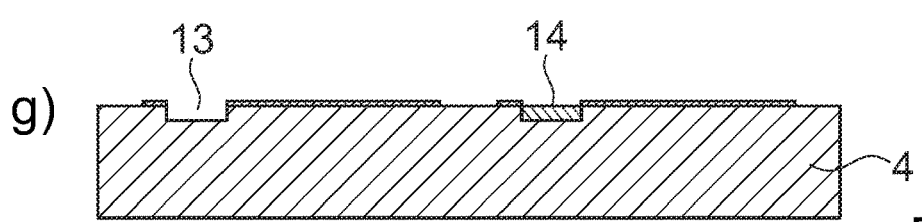

The cover wafer 1 having filter layers 2 is the thickest and imparts its stability to the wafer assembly to be provided, together with the bars 1' supported on the strips 5'. The central wafer 3 contains a multiplicity of thermal sensor pixels 5 and cavities 11 in the central wafer 3 below each sensor pixel 5, which are respectively delimited by a membrane 5" which is connected to the surrounding central wafer 3. On each membrane 5", there is an IR radiation absorber in the form of an umbrella 7 (FIG. 2). The cavities 11 are delimited laterally by substantially vertical walls in the central wafer 3 and, at the top according to the drawing, by the membrane.

These explanations also apply in principle for the embodiments furthermore described, in order to avoid repetition.

The bottom wafer 4, which is provided with an introduced getter 14 below each group of sensor pixels 5, has been greatly thinned after the respective mounting, to typically a thickness of <50 . . . 100 µm. The sensor pixels 5 with the cavities 10 and 11, which surround the sensor pixels 5 in a thermally insulating fashion, are hermetically tightly enclosed under a vacuum atmosphere during the closure. If necessary, the effects of degassing on the stable vacuum are suppressed by igniting the getter 14.

For the transmission of the electrical signals generated by the pixels 5, there are contact pads 15 on the bottom wafer 4 in the edge region outside the cover wafer 1 for wire bridges 17.

FIG. 2 represents a method for preparing the three partial wafers (cover wafer 1, central wafer 3, bottom wafer 4) for the wafer mounting (WLP).

In the first step, a silicon wafer polished on both sides (FIG. 2a), the future cover wafer 1, as described above, is provided with the cavities 10 (FIG. 2b) and subsequently coated with antireflection or filter layers 2 on both sides (FIG. 2c). These filter layers 2 could also be applied on lenses of optics, which may be located over the cavities 10. However, the cost outlay is significantly greater for the individual lenses than for filters in the wafer assembly.

On the central wafer 3, the sensor wafer, the sensor pixels 5 are produced (FIG. 2d) and preferably provided with additional three-dimensional absorber structures, the umbrellas 7 on the membranes 5", in order to increase the fill factor on the sensor pixels 5 (FIG. 2e), by the umbrellas 7 extending areally beyond the dimensions of the membranes 5" located underneath without touching neighboring umbrellas 5".

Further CMOS structures 8 are integrated (FIG. 2f) on the upper side of the bottom wafer 4, and for each chip (i.e. for each group of sensor pixels 5) at least one cavity 13 is created in the bottom wafer 4 for introducing the getter 14 (FIG. 3g). Since the production of the CMOS structures 8 is well known, this will not be discussed in detail here.

The CMOS structures 8 contain CMOS evaluation circuits and optionally further circuits for signal processing up to image processors. The integration of an EEPROM is also particularly advantageous in order subsequently to store measurement and calibration values of the individual sensor pixels 5 in the infrared sensor array itself. Furthermore, the central wafer 3 is preferably provided with through-contacts 6 (FIG. 7) from the CMOS side having electrical terminals to the lower side of the wafer.

At a position underneath the future pixel region, a cavity 13 is preferably introduced in the bottom wafer 4, or below each group of sensor pixels 5, by a conventional silicon wet or dry etching step and the getter 14 is deposited therein in order to be able to produce a long-term stable vacuum. This region may be small and lie both below and next to the pixels, but must be connected to the front side of the central wafer 3 by means of one or more holes etched in the membrane 5".

Figure 3:
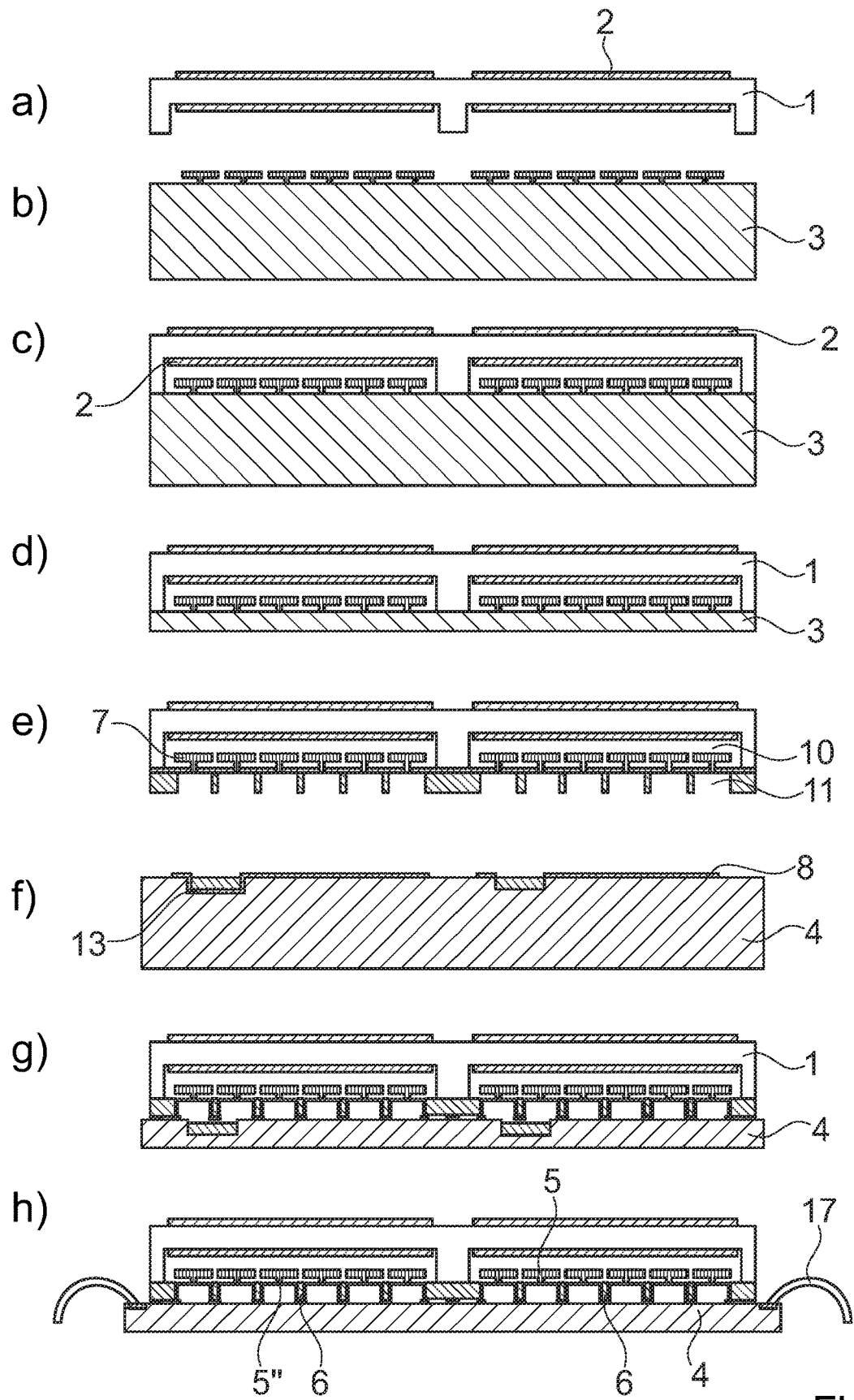
FIG. 3 shows the individual mounting steps of the individual wafers to form a thin wafer assembly in the wafer-level package with cavities etched free from the backside below the pixels in the sensor wafer.

The mounting of the three individual wafers to form a complete wafer stack is shown in a first embodiment by FIG. 3, with the mounting steps of the three individual wafers to form a thin wafer assembly in the wafer-level package with cavities 11 etched from the backside in the central wafer 3 below the sensor pixels 5.

Figure 7:
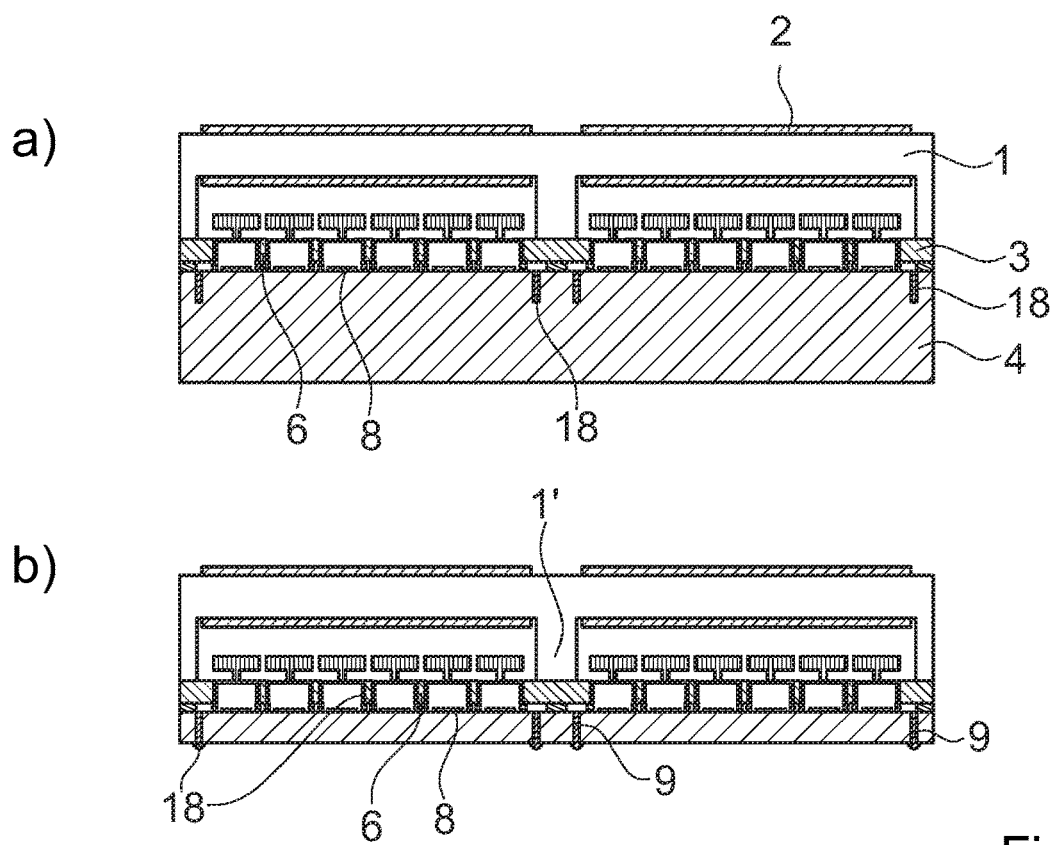
FIG. 7 shows a configuration of a very thin thermal array for a surface-mountable housing (SMD-capable housing)

The cover wafer 1 and the central thermopile wafer, i.e. the central wafer 3 (FIG. 3a), are joined to form a fixed assembly (FIG. 3c), for example by wafer bonding or adhesive bonding. This is followed by the thinning of the sensor wafer 3 (FIG. 3d) from the backside, or lower side, and a step of deep etching into the sensor wafer 3 (FIG. 3e) in order respectively to produce a cavity 11 below each pixel 5, as well as the alignment and mounting of the bottom wafer 4 on the central wafer 3 (FIG. 3f). Lastly, thinning of the bottom wafer 4 (FIG. 3g) is carried out, likewise from the backside, as well as the electrical contacting (FIG. 3h) of the completed sandwich arrangement with a wiring support by wire bridges 17, or alternatively by means of through-contacts 6 between the sensor pixels 5 (FIG. 7).

Although other thermal sensor methods are also possible, such as pyroelectric or bolometric sensor pixels, the sensor principle will be described as a result with reference to the example of a thermopile pixel, the design of which is known in principle.

For the sake of completeness, it should however be mentioned that in contrast to FIG. 1 the umbrellas 7 on the membranes 5" are suspended over the cavities 11 by means of narrow beams 11', as is seen from FIG. 9g, slits 11" for thermal insulation being formed between the beams 11' and the membrane 5" as well as between the beams 11' and the edge of the central wafer 3 which laterally surrounds the cavities 11. At thermopile pixels, thermophilic structures, the "hot" contacts of which are located on the membrane 5" and the "cold" contacts of which are located on the edge surrounding the cavities 11, which functions as a heat sink, extend over the beams 11'.

It should furthermore remain mentioned that this particular variant is obtained by joining together the flipped future bottom wafer 4 on the thermopile wafer, the lower side of the membrane 5" of the flipped wafer assembly (FIG. 9f,g) having been applied.

During the mounting, in the first main step the cover wafer 1 having the cavities 10 and the applied filter layers 2 is aligned relative to the central wafer 3 (FIG. 3b) so that the sensitive sensor pixels 5 can project with the corresponding absorber layers (for example umbrellas 7 over the membranes 5") located on them into the cavity of the cover wafer 10.

The alignment of the three wafers may be carried out by means of dry- or wet-etched structures in the cover wafer 1, for example by means of a suitable infrared microscope.

The two wafers (cover wafer 1 and central wafer 3) are connected to one another mechanically firmly and hermetically tightly (FIG. 3c). This is done by eutectic wafer bonding methods known per se (for example anodic bonding, soldering, or fusing glass frits, adhesive bonding or welding). Although the glass frit method is preferred because it is well known, the eutectic bonding method, in particular the SLID method using solid-liquid interdiffusion, also very much offers advantages. The bonding temperature is sometimes significantly below 400° C. and is therefore fully CMOS-compatible. The selection of the materials must naturally be carried out carefully according to the required CMOS compatibility.

A liquid eutectic is formed during the bonding on the interface between the two wafers. During the cooling process, a material bond is then formed between the wafers. Because of this material bond, besides a very good hermetic tightness, the stability of the stack produced is very high, which is advantageous for the following process steps.

Subsequently, the backside of the central wafer 3 is thinned (for example by mechanical methods such as grinding and polishing), see FIG. 3d. The remaining thickness of the central wafer 3, or of the wafer having the sensor pixels 5, should be no more than 200 . . . 300 μm, better yet <20 . . . 50 μm, before the membranes 5" are etched free from the backside below the sensor pixels 5, for example by dry etching (DRIE) and the thermally insulating cavities 11 are thereby formed (see FIG. 3e). In this case, the through-contacts 6 (so-called vias 6—see for example in FIG. 5, 7 or 8) may also be formed from the central wafer 3 to the bottom wafer 4 having the further modules of the CMOS signal processing 8. For the through-contacts 6 as well, it is found that they may be produced with significantly smaller lateral dimensions and more precisely through the greatly thinned central wafer or wafers 3.

Thinning before the DRIE etching process and the production of the through-contacts 6 has several important functions:

The thickness of the central wafer 3 of typically 400-500 μm may be reduced to very small substrate thicknesses of preferably <20 . . . 50 μm, which reduces the thickness of the overall construction.

The very thin residual substrate of the central wafer 3 may be etched through substantially more precisely by DRIE etching because the tolerances during the etching process (so-called tilt) with a decreasing wafer thicknesses naturally have no or only very little influence on the transfer accuracy of the etching mask used for the etching. By means of DRIE, the etching mask is transferred with very high accuracy onto the side facing toward the upper cover wafer 1, so that very small pixel structures are possible.

The lateral size of the through-contacts 6 may be reduced very significantly because of the very thin central wafer 3.

The DRIE etching process (conventionally carried out mostly as a single-wafer process) is possible more rapidly and therefore substantially more economically because of this small etching depth.

In the next mounting step, the bottom wafer 4 having the CMOS circuit 8 on the front side and the cavities 13 for the getter 14 is aligned at the front with the two upper wafers (cover wafer 1 and central wafer 3) already mounted on one another (FIG. 3f) and is mechanically connected firmly by wafer bonding. This bottom wafer 4 is subsequently also thinned on the bulk side (backside) (FIG. 2g), and the possibly required or existing electrical through-contacts 6 (so-called through-silicon vias, TSV) are formed and contacted.

In order to achieve a highest possible temperature resolution, the central wafer 3 should be enclosed hermetically tightly in a vacuum atmosphere. This may already be done in the normal wafer-level package.

While an additional getter is not necessarily required, it has nevertheless been found that an introduced getter 14, which is preferably activated by thermal excitation, "heating", during or after the wafer bonding, assists a long-term stable vacuum. Electrically activated getters 14 are also possible, and corresponding supply lines must be introduced into the bottom wafer 4 for this.

The getter may in principle also be accommodated in the cover wafer 1 (see FIG. 6a) or at the edge of the central wafer 3 next to the sensor pixels 5. Since the central wafer 3 must functionally have holes (through slits 11" in the membrane 5" and holes in the substrate), however, the most elegant and most preferred method is to accommodate the getter 14 in the bottom wafer 4 underneath the sensor pixels 5. This is because the arrangement of the slits 11" and holes in the central wafer 3 readily allows the gas exchange from the upper side to the lower side.

In a last step, after the individualization into individual separate array chips, the sandwich consisting of the connected and thinned three wafers is mounted on a wiring support (not represented in FIG. 3h) and electrically contacted for example by means of wire bond bridges 17 (FIG. 3h). Such a wiring support may be a circuit board (PCB, for example the circuit board in a cellphone), a metal housing or a so-called QFN housing having a very thin bottom.

In this way, the overall assembly of the individual wafers may not be substantially thicker than an individual wafer. This is because, as an overall assembly with a thickness of for example only 500 μm, it may be readily handled (processed, measured and transported) and divided into individual chips.

Figure 4:
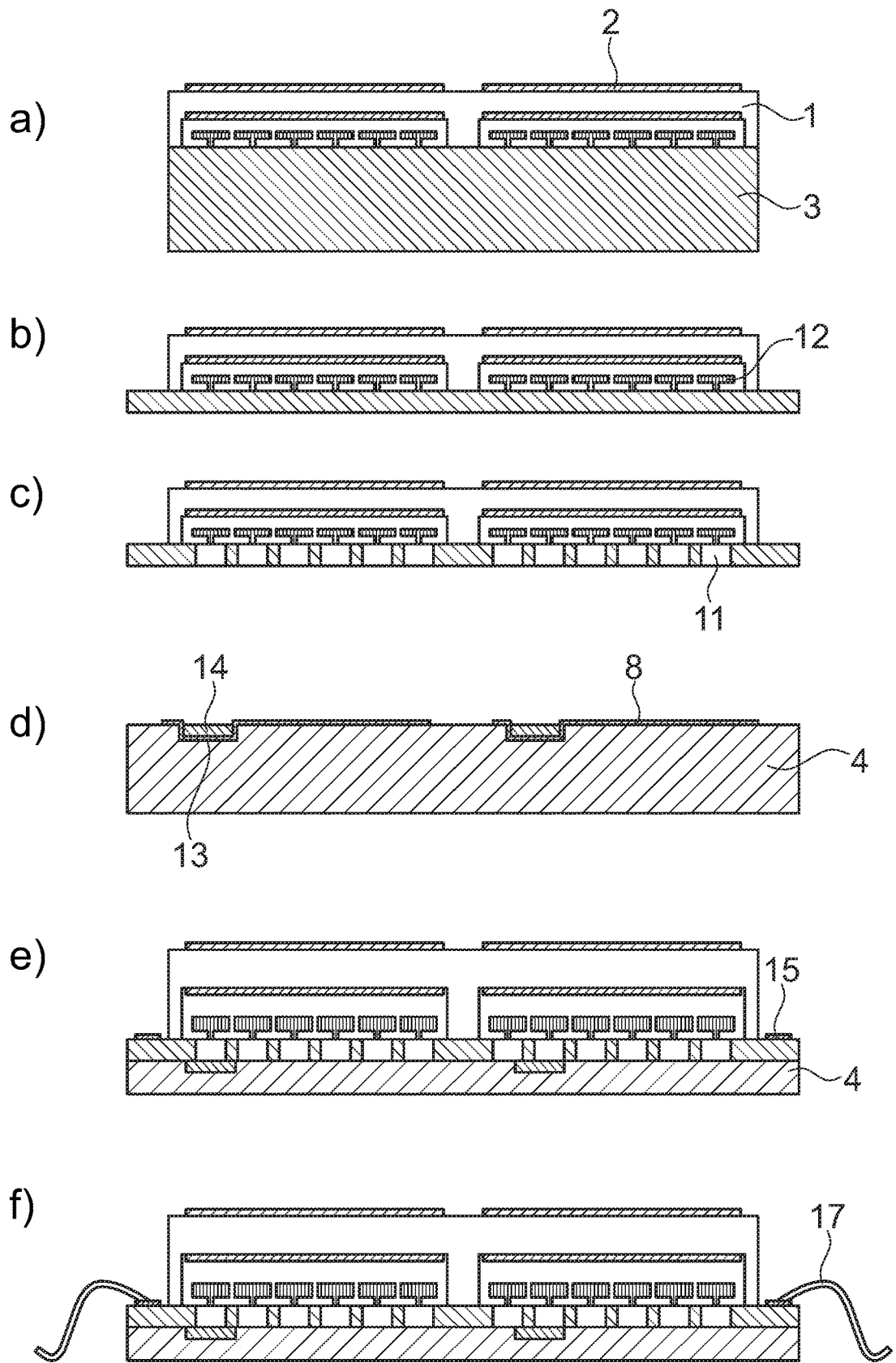
FIG. 4 shows one configuration of a very thin thermal array chip in the WLP which makes do without through-contacts (TSVs)

One particularly easy-to-produce configuration of the thermopile array makes do entirely without TSVs (vias) and is represented in FIG. 4.

The first four steps are carried out accordingly as in FIG. 3a-d. Here, the method is combined in FIGS. 4a and b) for brevity.

This is followed by the backside etching step (FIG. 4c), during which the cavities 11 for the thermal insulation of the membranes lying above for the sensor pixels 5 are formed, no through-contacts being prepared. The bottom wafer 4 is prepared with cavities 13 for the getter 14, and the latter is introduced (FIG. 4d), and is connected to the upper two wafers already mounted on one another and thinned (FIG. 4e). On the upper side of the central wafer 3 having the sensor pixels 5 and the CMOS signal processing 8, conventional bond pads 15 are applied at the outer edge of each chip.

These are, for example, exposed by a sawing cut from above with a wider saw blade into the wafer assembly before the assembly is separated into individual chips with a thin saw blade. After the exposure of the bond pads 15 and before the individualization of the wafer stack, the thermopile arrays may be tested for their function with conventional automated wafer samplers while still in the wafer assembly.

In the last step (FIG. 4f), the individualized thermopile sensor array chip consisting of three partial wafers is electrically connected to external modules by conventional wire bonding methods with wire bridges 17. By means of these wire bridges 17 and a simple adhesive or solder connection, the entire array chip may be mounted, for example as a chip-on-board on a circuit board, in a ceramic or metal housing, or particularly preferably in a so-called QFN package having a very thin bottom, in order to maintain the advantage of the flat housing.

The basic principle of the very thin wafer-level package for thermal sensors having particularly small sensor pixels 5 may also be configured for the variant in which the cavities 10, 11 for the thermal insulation of the sensor pixels 5 are not etched from below through the central wafer but are introduced from above by means of sacrificial layer technologies known per se (so-called surface micromachining).

Figure 5:
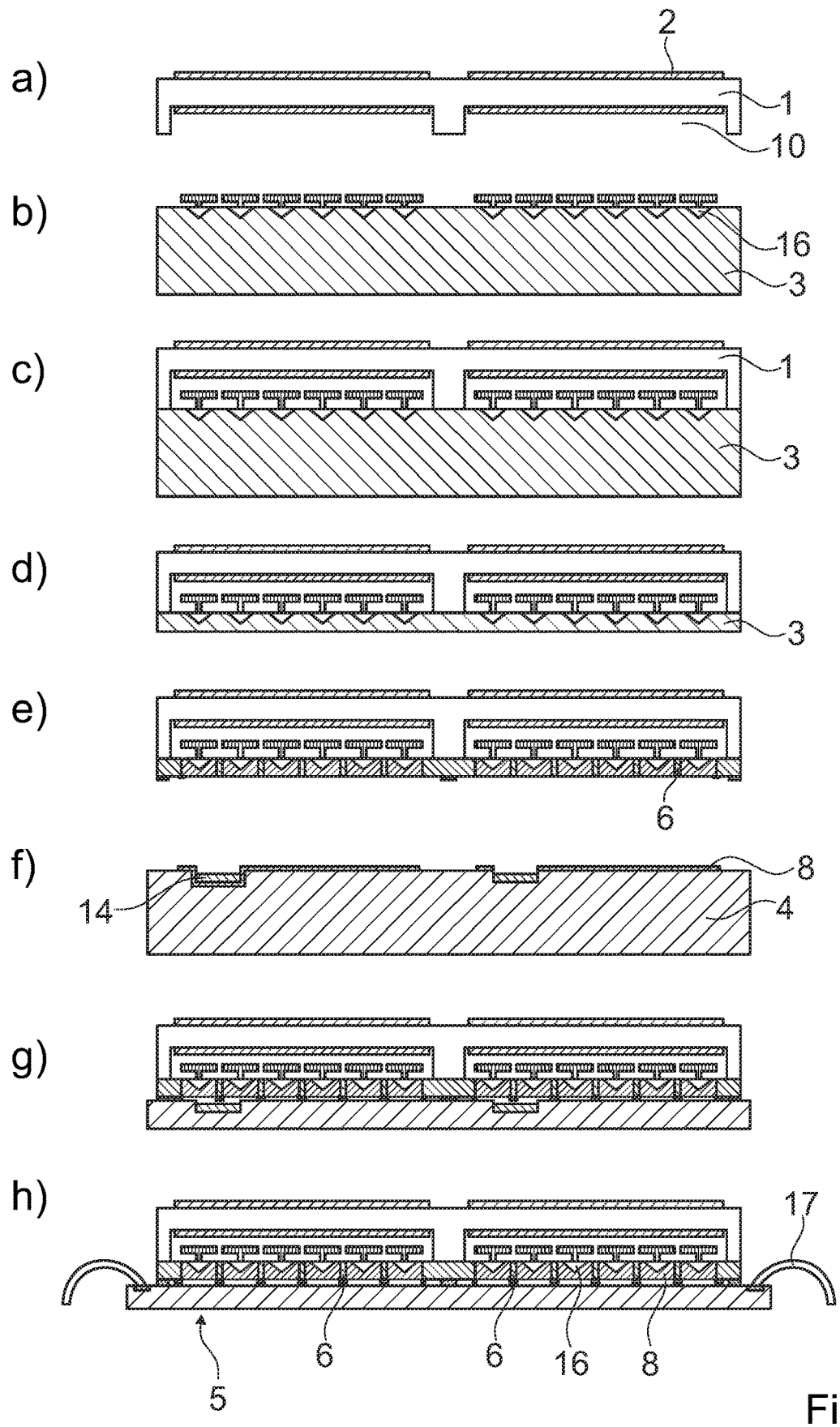
FIG. 5 shows one configuration of a very thin thermal array chip in the WLP with cavities etched free on the front side in the sensor wafer.

Such a variant is represented in FIG. 5, in which the configuration of the high-resolution thermal sensor in the vacuum wafer-level package (WLP) having three wafers is represented, and in which the cavity 16 for the thermal insulation of the sensor pixels 5 is etched out from above the central wafer 3 by known sacrificial layer technologies.

A cavity 16 is produced therein below each sensor pixel 5 in the central wafer 3 having the thermally sensitive sensor pixels 5 (FIG. 5*b*), using sacrificial layer technology known per se by slits 11" in the membrane 5". This may for example be done using sacrificial layers known per se (such as porous silicon) or as an oxide in SOI technology, or else by anisotropic wet etching of the bulk silicon below the membrane of the sensor pixel 5. The detached materials are led outward through the slits 11" in the membrane 5".

The resulting cavities 16 below each sensor pixel 5 ensure that the slitted membrane 5" having the infrared-sensitive functional layers of the sensor pixels 5 is thermally insulated from the silicon substrate (central wafer 3) and allows a high sensor signal under the future vacuum atmosphere.

If inter alia the method of anisotropic etching is used, then for very small pixels (of for example <50 µm), there is also a small etching depth of only a few 10 µm, so that the central wafer 3 can be thinned correspondingly greatly without the cavity 16 being etched-through outward to the lower side of the central wafer 3, which would prevent a vacuum seal.

During the mounting, the central wafer 3 (FIG. 5*b*) is firmly connected in an equivalent way to the cover wafer 1 (FIG. 5*a*) by wafer bonding (FIG. 5*c*) and subsequently thinned to a small thickness (FIG. 5*d*). As in the previous exemplary embodiment in FIG. 3, electrical through-contacts 6 (TSVs) are provided between the front side and backside of the central wafer 3 having the sensor pixels 5 or the first stages, integrated on the central wafer 3, of the signal processing channels 8 (FIG. 5*e*). Furthermore, at least one hole should preferably be etched through the central wafer (not represented), or one or more cavities 16 should be etched anisotropically through the entire wafer or the wafer should be thinned to such an extent that the cavities 16 are exposed, so that the getter 14 in the cavity 13 of the bottom wafer 4 (FIG. 5*f*) can ensure a stable vacuum in the cavities 10, 16 underneath and above the sensor pixels 5.

In principle, the getter may also be deposited in the cavity of the cover wafer 10 having the filter layers (see FIG. 6*a*), although there is more space in the bottom wafer 4 and there are also fewer perturbing effects for the sensor pixels 5 and the filter layers during the activation of the getter 14.

The bottom wafer 4 having the further CMOS signal processing components 8 is connected mechanically firmly and hermetically tightly to the cover wafer 1 and the central wafer 3 by conventional wafer bonding (FIG. 5*g*) and is thinned to a small thickness so that this WLP triple assembly can also be very thin (<0.5 to <1.0 mm).

Figure 6:
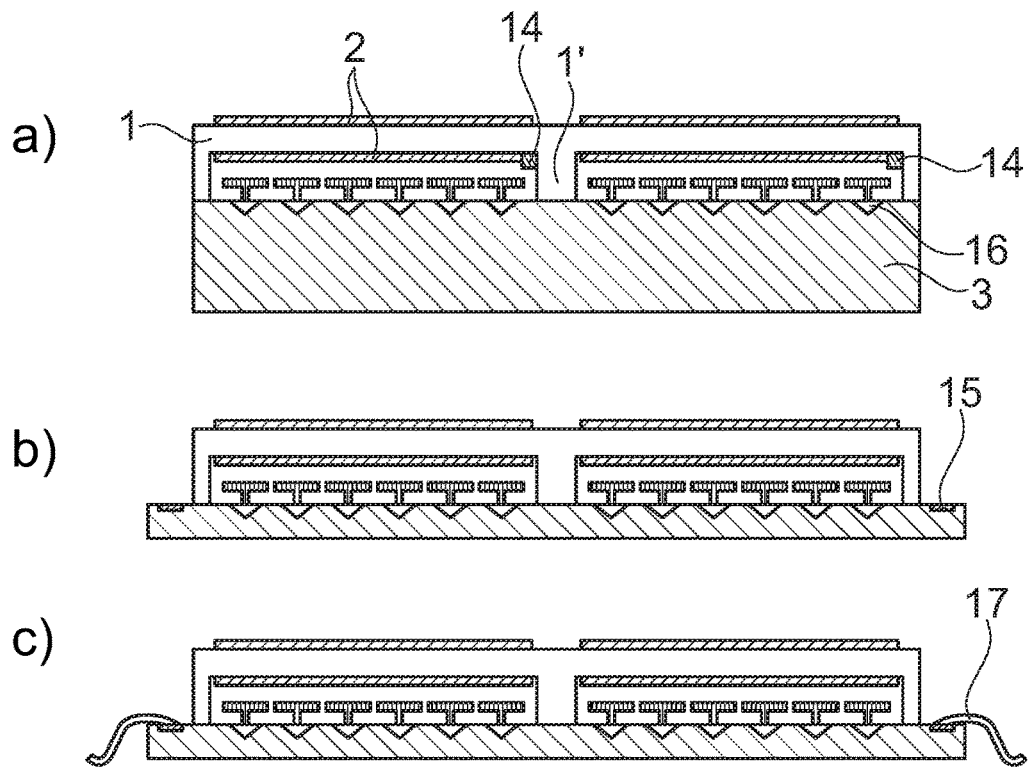
FIG. 6 shows a particularly simplified configuration of a very thin thermopile array in the wafer-level housing with only two wafers.

As a special form (unlike all other solutions with three or more wafers in the assembly) there is also a particularly simple configuration for a thermopile array having cavities 16 etched in from above, which is represented in FIG. 6.

FIG. 6 shows a configuration of the high-resolution thermal sensor in the vacuum wafer-level package having only two wafers, the cover wafer 1 and the central wafer 3, wherein the cavity 16 for the thermal insulation of the sensor pixels 5 is etched out from above the central wafer 3 by known sacrificial layer technologies.

The first steps are carried out in an equivalent way to the variant according to FIG. 5. In contrast to the solution in FIG. 5, however, the configuration shown in FIG. 6 does not require any through-contacts 6 or else a bottom wafer 4.

A getter 14 must in this case be introduced as far as possible on the outermost edge of the cavity 10 of the cover wafer 1 next to the filter layer 2 opposite the sensor pixels 5 (FIG. 6*a*), so that the viewing angle of the sensor array is not restricted.

After the wafer-to-wafer bonding of the cover wafer 1 and the central wafer 3 with the cavities 16 below the sensor pixels 5, the (central) wafer 3 having the pixels 5 is thinned in the assembly (FIG. 6*b*) and electrical contacts are fed to electronics outside the array chip by means of bond pads 15 at the chip edge and contact bridges 17 (FIG. 6*c*). It is to be understood that a multiplicity of bond pads 15 with wire bridges 17 may be required for this.

Even though this two-wafer solution seems very simple, certain disadvantages in comparison with all other solutions having three or more wafers are to be pointed out:

The integration density is significantly less than with the preceding solutions since no signal processing can be "shifted" to the bottom wafer, which is not present here, and the getter 14 has to be accommodated next to the filter layer 2 in the cavity 10 of the cover wafer 1.

While the final thickness of the array after the thinning of the (central) wafer 3 may be very small (the solution in FIG. 6 fulfills this aim), the lateral dimension of the (central) wafer 3 must be greater in order to accommodate the entire pixel-side signal processing thereon. This increases the external dimension of the array chip, or fewer sensor pixels 5 can be accommodated on a chip with the same size.

Because of the lower level of integration, with an equal overall size, there are therefore losses in the temperature resolution and/or in the spatial resolution (minimum pixel size) compared with the preceding solutions.

In this variant, it is recommended for the thickness of the central wafer 3 to be thinned less greatly, or to be left with a similar thickness to the cavity 10 of the cover wafer 1. This entails fewer problems with respect to the bending of the cover wafer 1 and the central wafer 3 chips because of the vacuum inside.

In another embodiment, the particularly flat "sandwich" consisting of three wafers may be configured in such a way that it is "surface-mountable" (SMD-capable) (see FIG. 7).

In this case, both the sensor chip in the central wafer 3 and the bottom wafer 4 must be equipped with through-contacts 6, 18 (TSV vias) known per se (FIG. 7*a*).

Such through-contacts 6, 18 may in the current prior art have lateral dimensions of a few µm. Very thin wafers are a prerequisite for this. In this way, they may be both accommodated in the corner region of the individual sensor pixels 5 (which may lead to the relocation of the entire pixel-side signal processing 8 into the bottom wafer 4) and in the edge region of the central wafer 3, next to the pixel field (focal plane), in order to place a part of the signal processing 8 into the bottom wafer 4.

The through-contacts 6 respectively terminate with contact pads (not represented separately), so as to allow through-contacts 18 (electrical contacts) through the bottom wafer 4 between the two wafers after mounting.

The backside of the bottom wafer 4 receives solder bumps 9, which are placed onto the through-contacts 18 of the thinned bottom wafer 4 after the thinning (FIG. 7*b*).

In order to achieve the surface mountability, the bottom wafer 4 contains
 through-contacts 18 (TSVs) having a particularly small diameter from the surface having the CMOS structures 8 to the lower side of the central wafer 3 and of the bottom wafer 4, from where the contacts for the interface are fed outward to external modules of the further signal processing, or to the voltage supply;
 solder bumps 9 on the lower ends of the through-contacts 18 in order to connect the sensor chip (central wafer 3) mechanically and electrically to an underlying wiring support (for example a circuit board—not represented).

During the mounting of the three wafers, however, some specifics should be noted:

For instance, the wafers must be oriented very accurately with respect to one another, which may be achieved for example with the aid of holes etched using dry etching technology (DRIE) or similar etching methods in the cover wafer 1, which makes the comparison of alignment marks possible. An infrared alignment method is also suitable for this because the silicon wafers are transparent for IR radiation.

An alignment hole or else a plurality of asymmetrical holes or notches in the corners of the upper cover wafer 1 (filter wafer) may contribute for the precise, position-oriented mounting of the wafer stack during the SMD process.

In one particular embodiment, through-contacts 6 to the underlying bottom wafer 4, on which the CMOS signal processing takes place, are introduced in the central wafer 3 in the corners of each sensor pixel 5.

Figure 8:
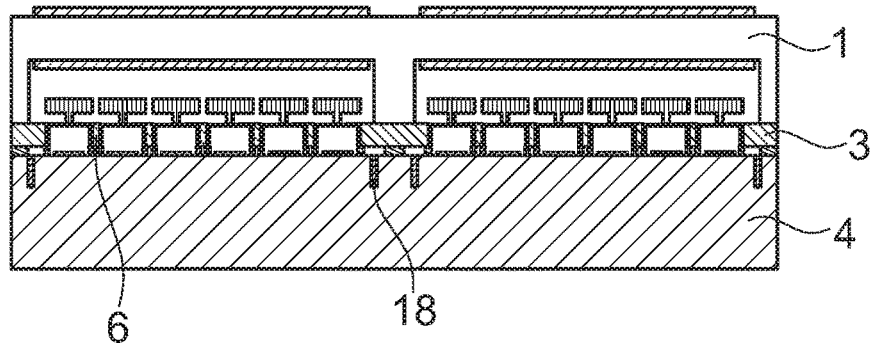
FIG. 8 shows a further configuration of a thermopile array having an additional bottom wafer, which contains further signal or image processing components.
Figure 8:
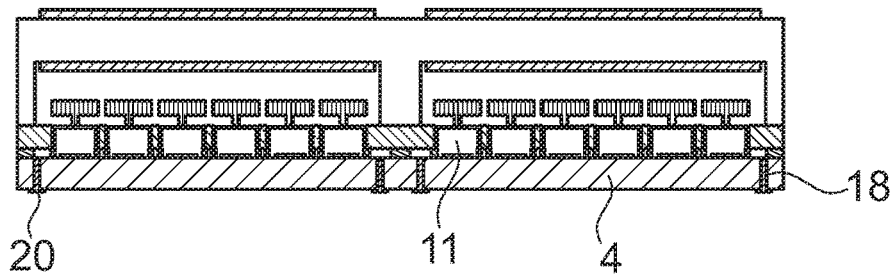
Figure 8:
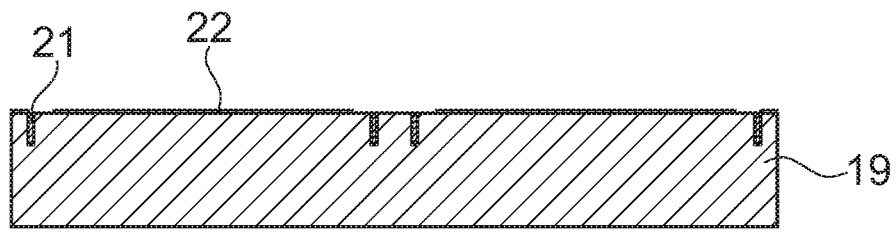
Figure 8:
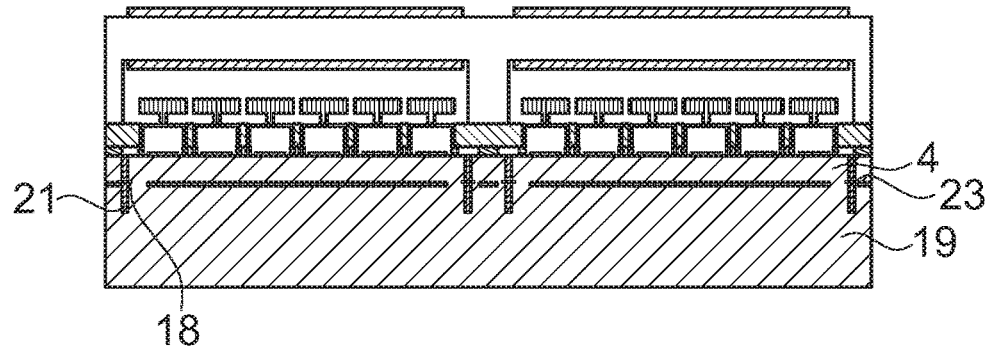
Figure 8:
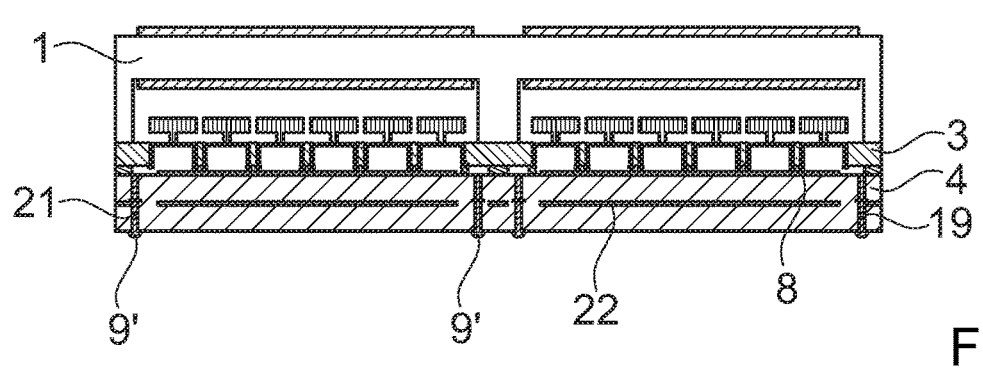

In another particular embodiment, a further bottom wafer 19 (CMOS wafer) may be mounted below the bottom wafer 4 having the sensor-side (analog/digital) signal processing (see FIG. 8). This additional bottom wafer 19 may contain further image processing functions, for example an image processor, large data memories or other digital calculation units. With equal external dimensions (length/width) and only a slightly greater thickness, the sensor chip may therefore undertake even more image processing functions.

To this end, the wafer stack is premounted with the original bottom wafer 4 (FIG. 8*a*) and thinned, as described above. After the contact formation, however, solder bumps are not applied on the bottom wafer 4, but only contact pads 20 which allow the future electrical connection to the additional bottom wafer 19 (FIG. 8*b*). The additional bottom wafer 19 having additional signal processing components 22, for example image processors or relatively large digital image memories, is subsequently aligned with the upper wafers and the through-contacts 21 matching the bottom wafer 4 are formed in the second bottom wafer 19, and corresponding vias for the final electrical contacting of the entire module of the wafer stack via contact bumps 9' at the lower end of the intermediate connections 21 are prepared (FIG. 8*e*).

The upper wafers and the additional bottom wafer 19 are mechanically connected firmly by conventional wafer bonding methods to the bottom wafer 4, and contact formation (electrical intermediate connection) is carried out between the wafer sides that lie on one another (FIG. 8*d*).

In the last method steps, the additional bottom wafer 19 is thinned and the contact bumps 9 for the SMD mounting (for example soldering tin, conductive adhesives or the like) are subsequently formed (see FIG. 8*e*).

After the thinning, the 4-fold wafer stack thus formed may have an overall thickness of <0.5 . . . <1 mm, because the cover wafer 1 (filter wafer) remains the thickest, while the three wafers arranged underneath can respectively be thinned in the assembly to <100 μm so long as the wafer stack overall has sufficient mechanical stability for the wafer handling.

Figure 9:
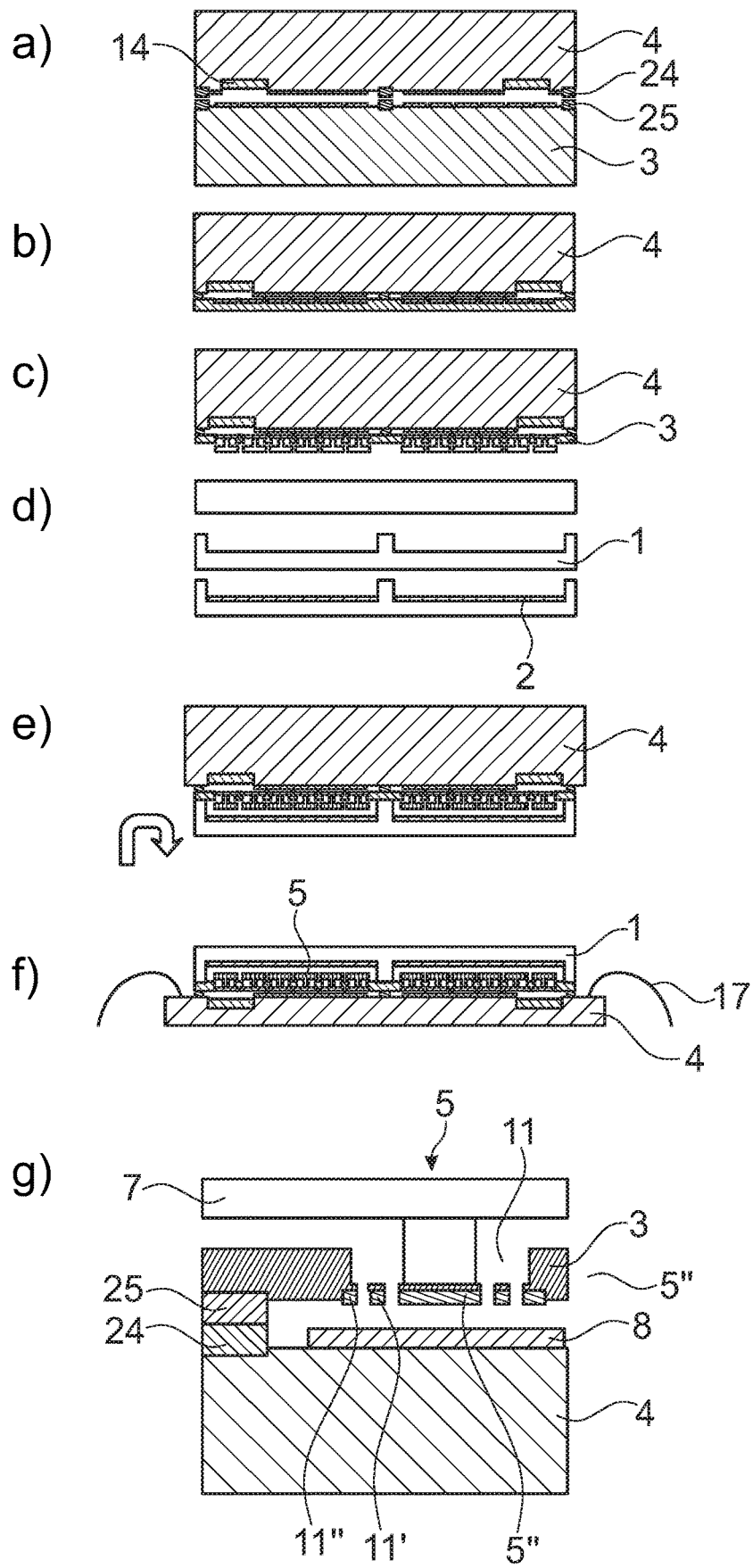
FIG. 9 shows one configuration of a very thin infrared array with a flipped mounting of the thermopile wafer.

FIG. 9 represents a further configuration of the thermopile array in the wafer-level package, which also makes do without TSV. In contrast to FIG. 4, which also makes do without TSV, however, direct electrical contact by means of the respective contact pads 25 of the central wafer 3 and the contact pads 24 of the bottom wafer 4 having integrated advanced image processing is possible here because of the flipped mounting (FIG. 9*a, g*). It is therefore even possible to integrate the evaluation electronics completely on the bottom wafer 4 and to free up space for more sensor pixels 5. The pixel density may therefore be increased even more.

FIG. 9 shows a thermopile array in the wafer-level package having a flipped, very greatly thinned central wafer 3 without vias (through-contacts) (FIG. 9*a-f*) and FIG. 9*g* shows an enlarged individual unit having an umbrella 7 on the membrane 5".

This is a particularly economical variant. The bottom wafer 4 is positioned here with the front side on the front side of the central wafer 3. The two front sides with the respective contact pads and a solder paste, or the like, or with means (not represented) providing an electrical contact are oriented with respect to one another. The bottom wafer 4 with the contact pads 24 on the bottom wafer 4 is then aligned directly onto the contact pads 25 with the central wafer 3 (FIG. 9*a*). The two wafers are thereupon mechanically connected firmly to one another by conventional wafer bonding methods and the central wafer 3 is subsequently thinned very greatly, ideally to <15 μm (FIG. 9*b*).

The cavities 11 for the pixels are subsequently made by means of DRIE and the three-dimensional absorber structure, i.e. the umbrellas 7, is introduced therein (FIG. 9*c*). The cover wafer 1 is thinned and the cavities and the filter layers are inserted (FIG. 9*d*). The cover wafer 1 is thereupon mechanically connected firmly to the wafer assembly consisting of the bottom wafer 4 and the central wafer 3 by conventional wafer bonding methods (FIG. 9*e*).

The entire wafer assembly consisting of the three wafers is subsequently flipped so that the bottom wafer 4 is now underneath (FIG. 9*f*). The chip may now be placed and adhesively bonded on a suitable base and electrically contacted by means of wire bond bridges 17 to an underlying substrate (not represented).

The application of solder bumps as mentioned in previous embodiments is also possible in order to apply the chip onto underlying substrates such as a printed circuit board (PCB) or the like. The wire bond bridges 17 are in this case superfluous. Because of this method, through-contacts are not necessary since the CMOS electronics on the bottom and central wafers (4; 3) are contacted directly by means of the respective contact pads 24, 25.

For illustration, FIG. 9*g* represents a detail of a pixel region. The umbrella 7 is located on the membrane 5" in the cavity 11 of the sensor pixel 5 (in contrast to the previous embodiments). The contact pad 24 of the bottom wafer 4 is electrically connected to the contact pad 25 of the central wafer 3. The signal processing 8 (CMOS processing) is located on the bottom wafer 4.

For the sake of completeness, it should be mentioned that in principle further thin wafers may also be added to the wafer stack. An electricity-saving semiconductor technology, in particular for the signal processing circuits and microprocessor circuits on the lower wafers, is desirable so that the overall power loss does not have any sizeable effects on the so-called heat shock problem of the thermally sensitive wafer. An excessive power loss in the wafer stack leads to long transient processes after switching on and to measurement errors.

The exemplary embodiments described in FIGS. 3-9 with cavities 11, 16, which are etched from the front side or from the backside, for mounting by wire bonding in COB technology in QFN packages or automatic mounting by SMD as well as the use of further bottom wafers 19 having additional signal processing components may of course be combined with one another in any desired way.

With all the embodiments described, the object of constructing a particularly flat, vacuum-tight and mechanically stable thermopile array is achieved.

Furthermore—except for the simplified variants in FIG. 4 and FIG. 6—the exemplary embodiments have two substantial advantages in comparison with the prior art:

On the one hand, almost the entire area of the central wafer 3 can be used for the sensor pixels 5 themselves, while the considerable area likewise required for the signal processing channels 8 is arranged on the underlying bottom wafer 4. The smallest possible dimension of the sensor sandwich is thus achieved, which is in turn an advantage for small IR camera modules in so-called "mobile devices" (such as smartphones) which achieve a particularly high level of integration or high packing density.

On the other hand, the central wafer 3 having the sensor pixels 5 can be produced in a technology which is particularly tailored to thermopile structures, while the bottom wafer (or the further bottom wafers) 4, 19 can be produced in a "mixed signal" CMOS technology which does not need to integrate special thermopile structures or must take them into consideration.

According to FIG. 9, because of the flipped mounting it is even possible to accommodate the entire signal processing on the lower bottom wafer 19.

The second object of a particularly high-resolution (spatially and thermally) thermopile array is achieved by three measures:

The central wafer 3, especially in the solutions with a cavity 11 etched from the backside of the wafer (i.e. according to FIGS. 3, 4, 7 and 8, 9), has after the thinning to such a small residual thickness that it is possible to thereby construct much smaller thermopile pixels than has previously been known, i.e. the Si edges of the sensor pixels 5, which remain after the DRIE etching, around the cavities 11 (which are used for the thermal separation and as a heat sink for the cold contacts) can be reduced to a few micrometers. The remaining membrane size is therefore larger in relation to the pixel dimension, i.e. smaller pixels become possible (for example <25 . . . 50 μm).

The signal electronics (ROIC) are preferably accommodated on the bottom wafer 4, 19 by means of very small through-contacts 6 (having a small diameter). There is more space there than next to the thermopile array on the central wafer 3. In the ideal case, almost the entire chip area may be used for the focal plane array (FIG. 9).

If the bottom wafer 4 (or as in FIGS. 5, 7 and 8 a further bottom wafer 19) may be used with almost the entire chip area for the signal processing channels (SPC), then in a high-resolution array fewer sensor pixels 5 have to share a signal processing channel, or more area remains for individual preamplifiers. While the larger number of SPCs operating in parallel reduces the noise bandwidth, the noise of the preamplifier is reduced with a larger area. Both measures reduce the noise and improve the noise-limited temperature resolution of the pixels (NETD).

The functionality will be explained briefly with reference to a thermal array sensor having thermopile pixels. In principle, what follows also applies accordingly for other thermal sensor principles such as pyroelectric sensors or microbolometers.

The thermopile structures are integrated in a known way on a silicon chip, which is produced on a wafer (the central wafer 3 having the sensor pixels 5). A thermopile array contains a large number of individual sensor pixels 5, which are conventionally arranged in matrix form in rows and columns.

Special CMOS-compatible microsystem technology methods lead after the actual CMOS process to the production of the sensor pixels 5, which are for example located on a thin dielectric layer such as silicon dioxide, silicon nitride, silicon carbide, or a combination thereof.

After the CMOS process of the central wafer 3, the MEMS process takes place. In the first phase of the MEMS process (still before mounting with the cover wafer 1), the passivation layers over the thermocouples are thinned and the future slits 11" for the thermal insulation of the beams 11' are introduced from the upper side of the wafer as far as the silicon bulk boundary. This is usually carried out by so-called dry etching or similar anisotropic methods.

The central part of the membrane 5" is equipped with an infrared absorber layer (FIG. 2d). For this, three-dimensional umbrellas 7 (shielding structures) are preferably produced in order to impart a particularly high fill factor to the sensor pixel 5 (FIG. 2e). Additional absorber layers may be applied on the umbrellas 7 in order to further increase the infrared sensitivity.

The further MEMS steps are carried out by known wafer bonding methods only after the mounting of cover wafer 1 and the central wafer (FIG. 3a-c).

The etching of the cavities 11 below the thermopile sensor pixels 5 (FIG. 3e) is carried out in all variants having an ideally backside-etched cavity 11 below the pixels only after the central wafer 3, or the wafer having the sensor pixels 5, in the wafer assembly with the cover wafer 1 has been thinned to a small thickness, in order to increase the precision of the etching accuracy. In principle, however, etching is also possible at another point if in particular CMOS compatibility requirements of wafer fabrication plants so allow and reliable wafer handling is ensured.

After the thinning of the central thermopile wafer 3 (FIG. 3d), the introduction of the cavity 11 into the already greatly (typically <50 . . . 100 μm) thinned central wafer 3 from the backside (FIG. 3e) is carried out by DRIE dry etching.

After the second MEMS phase, self-supporting thin membranes 5" are formed on the front side of the central wafer 3 from the aforementioned dielectric layers and insulation slits 11" for the bars (beams 11'), which besides the thermal insulation for the sensitive IR pixels subsequently also allow the gas exchange (vacuum between upper and lower sides of the sensor pixels) and the effective action of the getter (for example FIGS. 3f and g), as already described.

Hot contacts and the thermoelectric elements are located on the membranes 5" at the center of the thermopile sensor pixels 5. Between the zone of the hot contacts in the central part of the membrane 5" and the silicon sink, the thermocouples are carried on beams 11' (narrow connecting elements) which are thermally insulated by the slits 11" in the membrane 5" from the central part of the membrane 5" and the silicon sink (the silicon material surrounding the cavity 11), and heat transport from the hot contacts on the membrane 5" to the silicon sink is thus reduced.

Semiconductor materials having a high Seebeck coefficient may be envisioned for the thermocouples. Polysilicon, amorphous silicon layers, SiGe layers as well as specially implanted layers having a high thermoelectric coefficient (such as bismuth or antimony and compounds thereof) are possible.

The cover wafer 1 preferably consists of silicon, like all other wafers lying underneath, because all the wafers then have the same thermal expansion coefficient, although in principle other materials, such as glass substrates or other organic and inorganic materials, are also possible in order to satisfy the requirements for the optical properties needed (for example Ge or else so-called chalcogenides).

The bottom wafer 4, 19 is preferably made from silicon, although it may also consist of other materials such as glass—with the disadvantage of a lower level of integration because no signal processing functions, or far fewer signal processing functions, can then be integrated than is possible with silicon wafers. The bottom wafer 4, 19 may also consist of organic materials and, for example, contain organic electronics, in order to simplify use on flexible supports, as in foldable smartphones.

The processes and arrangements known per se in the production and mounting of the individual wafers have deliberately been discussed only very briefly here since they are already known.

The vacuum-filled wafer-level housing is to be understood as an evacuated wafer-level housing, or as a wafer-level housing in which a vacuum prevails.

Method for Producing a Thermal Infrared Sensor Array in a Vacuum-Filled Wafer-Level Housing

LIST OF REFERENCES 1 upper cover wafer
1' bar
2 filter layer
3 central wafer
4 bottom wafer
5 sensor pixel
5' strip
5" membrane
6 through-contact
7 umbrella (radiation collector)
8 CMOS signal processing channels
9 contact bump
9' contact bump
10 cavity in the filter wafer
11 cavity
11' beam
11" slit
12 pixel with umbrella
13 cavity
14 getter
15 bond pad
16 cavity
17 wire bridge
18 through-contact
19 additional bottom wafer
20 contact pad
21 contact pad
22 signal processing
23 contact pad
24 contact pad
25 contact pad

The invention claimed is:

1. A method for producing a thermal infrared sensor array in a vacuum-filled wafer-level housing comprising at least two wafers,
   a cover wafer (1) and
   a central wafer (3) having a plurality of infrared-sensitive pixels (5) respectively on a slitted membrane (5") over a thermally insulating cavity (11),
   the method comprising:
   initially providing the cover wafer (1) on an inner side with at least one cavity (10);
   firmly mechanically connecting the cover wafer (1) to the central wafer (3) having the plurality of infrared-sensitive pixels (5) by wafer bonding;
   subsequently thinning the central wafer (3) from a backside of the wafer to a predetermined thickness;
   fastening a bottom wafer (4) on the backside of the central wafer (3) by wafer bonding; and
   thinning the bottom wafer (4) after the wafer bonding.

2. The method as claimed in claim 1,
   wherein the thermally insulating cavity (11) is etched below the slitted membrane (5") of each infrared-sensitive sensor pixel (5) from a front side through slits (11") in the slitted membrane (5") into the central wafer (3) after the central wafer (3) has been thinned to a predetermined thickness.

3. The method as claimed in claim 1,
   wherein the thermally insulating cavity (11) is etched below the slitted membrane (5") of each infrared-sensitive pixel (5) from the backside into the central wafer (3) after the central wafer (3) has been thinned to the predetermined thickness.

4. The method as claimed in claim 1,
   wherein the central wafer (3) is thinned after the wafer bonding to a thickness of less than 100 μm.

5. The method as claimed in claim 1,
   wherein, in addition to the plurality of infrared-sensitive pixels (5), at least a part of a signal preprocessing of the plurality of infrared-sensitive pixels (5) is integrated on the central wafer (3).

6. The method as claimed in claim 1,
   wherein through-contacts (6) are introduced from a front side to the backside of the central wafer (3) into the central wafer (3) after the thinning.

7. The method as claimed in claim 6,
   wherein the through-contacts (6) of the central wafer (3) are mechanically and electrically connected to contact pads (20) on the front side of the bottom wafer (4), to through-contacts (18) of the bottom wafer (4) and to through-contacts (21) of an additional bottom wafer (19), and are subsequently thinned, and
   wherein the through-contacts (21) in the additional bottom wafer (19) are provided with contact pads (9').

8. The method as claimed in claim 1,
   wherein the bottom wafer (4) is thinned to a thickness of less than 200 μm after the wafer bonding.

9. The method as claimed in claim 1,
wherein the bottom wafer (4) is provided with a part of a signal processing of the sensor array.

10. The method as claimed in claim 1,
wherein the bottom wafer (4) is provided with through-contacts (18) from a front side to the backside.

11. The method as claimed in claim 1,
wherein the bottom wafer (4) respectively lying furthest below is provided on its lower side with metallizations which enable it for SMD mounting by soldering, welding or adhesive bonding.

12. The method as claimed in claim 1,
wherein the bottom wafer (4) is provided with at least one cavity (10), into which a getter (14) for stabilizing a vacuum is introduced, and
wherein hermeticity of a cavity (10) in the cover wafer (1) over the plurality of infrared-sensitive pixels (5) is ensured by said getter (14) after a subsequent activation thereof by a perforation in the plurality of infrared-sensitive pixels (5) or at least one additional hole in the central wafer (3).

13. The method as claimed in claim 1,
wherein at least one further bottom wafer (4') which contains further signal processing components, image processors or chips for artificial intelligence is arranged below the bottom wafer (4).

14. The method as claimed in claim 1,
wherein the cover wafer (1) is made from an infrared-transmissive material selected from the group consisting of silicon, germanium, zinc sulfide, chalcogenide, and a polymer.

15. A method for producing a thermal infrared sensor array in a vacuum-filled wafer-level housing comprising at least two wafers,
a cover wafer (1) and
a central wafer (3) having a plurality of infrared-sensitive pixels (5) respectively on a slitted membrane (5") over a thermally insulating cavity (11),
the method comprising:
initially providing the cover wafer (1) on an inner side with at least one cavity (10);
firmly mechanically connecting the cover wafer (1) to the central wafer (3) having the plurality of infrared-sensitive pixels (5) by wafer bonding;
subsequently thinning the central wafer (3) from a backside of the wafer to a predetermined thickness; and
applying infrared-transmissive antireflection or filter layers on both sides of the cover wafer (1).

16. The method as claimed in claim 15,
wherein the infrared-transmissive antireflection or filter layers are provided with a longpass or bandpass coating in order to block predetermined wavelength ranges.

17. The method as claimed in claim 1,
wherein the central wafer (3) is thinned to a thickness of less than 15 μm after the mechanical joining to the cover wafer (1).

* * * * *